United States Patent [19]
Zappe

[11] 3,764,863
[45] Oct. 9, 1973

[54] HIGH GAIN JOSEPHSON DEVICE

[75] Inventor: Hans H. Zappe, Granite Springs, N.Y.

[73] Assignee: International Business Machines Corporation, Armonk, N.Y.

[22] Filed: June 30, 1971

[21] Appl. No.: 158,315

[52] U.S. Cl. .......... 317/234 R, 307/306, 317/234 N, 317/234 T
[51] Int. Cl. .......... H01l 5/06
[58] Field of Search .......... 317/234 T; 307/306

[56] References Cited

UNITED STATES PATENTS

| | | | |
|---|---|---|---|
| 3,370,210 | 2/1968 | Fiske | 307/306 X |
| 3,564,351 | 2/1971 | McCumber | 317/234 T |
| 3,209,172 | 9/1965 | Young | 317/234 T |

OTHER PUBLICATIONS

Phys. Rev. Lett. 10, 479 (1963), Ferrell et al.
Phys. Rev. Lett. 11, 200 (1963), Rowell.
Pankove, RCA Technical Note No. 542, March 1962.
Stewart, RCA Technical Note No. 689, Jan. 1967.
Merrian, IBM Tech. Discl. Bull., Vol. 7, No. 3, p. 271 (Aug. 1964).
Matisoo, "The Tunneling Cryotron . . . ," Proc. IEEE, Vol. 55, No. 2, Feb. 1967, pp. 172–180.

*Primary Examiner*—John W. Huckert
*Assistant Examiner*—William D. Larkin
*Attorney*—Jackson E. Stanland et al.

[57] ABSTRACT

A high gain Josephson junction device having an asymmetric curve of maximum Josephson current ($I_m$) versus applied field (H). The magnetic field is proportional to the Josephson current ($I_J$) through the junction at each instant of time, and the constant of proportionality remains the same for each curve of $I_m$ versus H. Due to this asymmetry, a small change in magnetic control field $H_c$ will cause a large change in maximum Josephson current, $I_J$. Preferred embodiments return the Josephson current in a path over the junction to produce a magnetic field penetrating the junction which is always proportional to the Josephson current.

19 Claims, 11 Drawing Figures

INVENTOR
HANS H. ZAPPE

BY J. E. [signature]
AGENT

HIGH GAIN JOSEPHSON DEVICE

BACKGROUND OF THE INVENTION

1. Field of the Invention

This invention relates to Josephson junction devices and more particularly to such a device in which a small control current can switch a large Josephson current flowing through the device.

2. Description of the Prior Art

Josephson junction devices are based upon a phenomenon discovered by B. D. Josephson in 1962 and reported in *Physical Letters*, Vol. 1, Pages 251–253, July 1962. These devices are characterized by a Josephson tunneling current which exists in the absence of voltage across the tunnel junction. As the current throughout the device is increased, the device switches from a zero voltage state (pair tunneling) to a voltage state (single particle tunneling). Further explanation of these devices is contained in an article by J. Matisoo In *Proceedings of the IEEE*, Vol 55, No. 2, February 1967, at pages 172–180.

It is known that the maximum current $I_J$ which flows through a Josephson junction before the junction is switched to its finite voltage state can be changed by subjecting the tunneling junction to a magnetic field through the plane of the junction. A means for doing this using adjacent superconductive control lines is shown in U. S. Pat. No. 3,370,210. Additional discussion of magnetic field control using two externally applied magnetic fields is shown in U. S. Pat. No. 3,281,609. In particular, logic devices are described.

The Josephson device can be used as a device providing gain if the current flowing through the adjacent control lines produces large changes in the Josephson current flowing through the junction. An example of such a high gain Josephson device is provided in Ser. No. 771,101, filed Oct. 28, 1968 and abandoned in favor of continuation application Ser. No. 194,077, filed Oct. 27, 1971. and assigned to the present assignee. In that Josephson device, two superconductors are separated by a tunnel barrier. Current gains in the junction are greatly enhanced when the ratio $\lambda_J/L << 1$, where $\lambda_J$ is the Josephson penetration depth and L is the length of the tunnel junction in the direction of Josephson current therethrough. This device depends upon the self-field established by the Josephson current $I_J$; however, redistribution of the current $I_J$ through the junction limits the self-field so that no effect will be obtained if the junction is made very small (small L). Further, high power dissipation results due to the high current density.

Consequently, it is apparent that the prior art has not provided Josephson devices having improved current gain, without the introduction of additional problems. The prior art high gain device requires larger size junctions (or junctions with very small barrier thickness) using high current density. In systems requiring high currents throughout, these are not serious disadvantages. However, in systems requiring high gain with low Josephson currents such a device cannot be used.

Accordingly, it is an object of this invention to provide an improved high gain Josephson junction device in which the gains are adjustable.

It is another object of this invention to provide a Josephson junction device which will provide high gain with small size junctions.

It is still another object of this invention to provide a Josephson junction device which has high gain when low Josephson currents are used.

It is a further object of this invention to provide a Josephson junction device having adjustable high gains regardless of the tunnel barrier thickness.

It is a still further object of this invention to provide a Josephson junction device having gain which is independent of the junction geometry and which is present whether the junction is linear or non-linear.

SUMMARY OF THE INVENTION

A Josephson junction device is provided having magnetic control means for gain adjustment. The Josephson junction device is comprised of two superconducting electrodes separated by a tunnel barrier capable of supporting Josephson current therethrough. The barrier thickness will generally be 2–50 angstroms. The geometry of the junction is not important and the junction can be either linear or non-linear. In this regard, a linear junction is one in which the Josephson current distribution therethrough is uniform assuming a constant barrier thickness. That is, the effect of the self-field due to the Josephson current is negligible. On the other hand, a non-linear junction is one in which the distribution of Josephson currents through the junction is not uniform. In such a junction, the Josephson currents distribute themselves in such a way that shielding against the self-field or other externally applied magnetic fields results.

A current source is connected to the electrodes of the Josephson device to provide the tunneling current. Generally, the Josephson device is deposited on an insulator over a ground plane which in turn is deposited on a substrate.

The magnetic control means comprises a plurality of superconductive elements which overlie the Josephson device and are insulated therefrom. Current flow through the control elements establishes magnetic fields which intercept the plane of the junction. These magnetic fields affect the magnitude of the maximum Josephson current $I_m$ which can pass through the junction at zero voltage. The control means creates an asymmetric magnetic dependence of the junction rather than the usual sin X/X type of dependence which is normally observed (for a square junction area). The control means comprises at least one control superconductor having a current therein which is always instantaneously proportional to the Josephson current $I_J$ (i.e., the control current is $K_iI_J$, where $K_i$ is any number). By changing $K_i$, the gain of the device is changed. Here, gain is the change ($\Delta I_m$) in maximum Josephson current for a change in control current ($\Delta I_c$) flowing in another control superconductor.

In preferred embodiments, the control superconductor having the current $K_iI_J$ is provided by feeding back the Josephson current in a control superconductor overlying the tunnel junction. By varying the self-inductance L of the feedback path, the amount of Josephson current fed back is varied.

Generally, the device is operated by providing three (or more) control superconductors. One such conductor feeds back a current $K_iI_J$ proportional to the Josephson current, while a second superconductor has a bias current $I_B$ flowing in it which is used to provide a magnetic bias field to establish the operating point of the tunnel junction. A third control superconductor has a signal current $I_c$ therein, which is used to produce large changes in the maximum Josephson current $I_m$ flowing in the junction when $I_c$ is changed by a small amount.

For each plot of maximum Josephson current $I_m$versus external magnetic field, the constant $K_i$ is the same. Hosever, this constant can be changed in order to provide curves having different gain. In each curve, the current $K_iI_J$ is always instantaneously proportional to the Josephson current. The easiest way to provide this instantaneous proportionality is to return a portion of the Josephson current itself, although it is to be understood that the generator providing $I_J$ can also be used to provide the current $K_iI_J$ through the control superconductor.

These and other objects, features, and advantages will be apparent in the following description of the preferred embodiments as illustrated in the accompanying drawings.

DETAILED DESCRIPTION OF THE PREFERRED EMBODIMENTS

Figure 1:
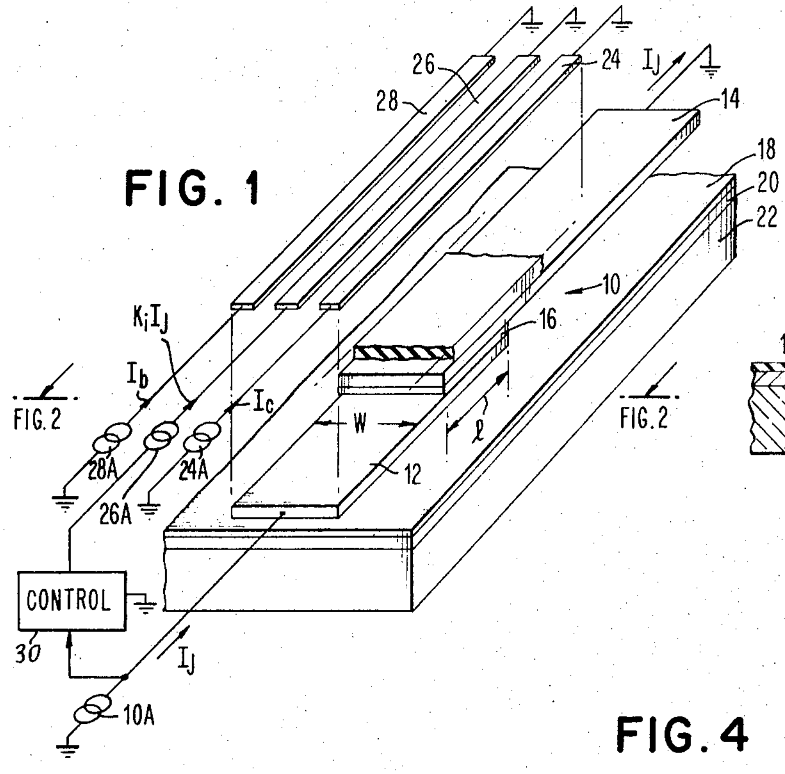
FIG. 1 is an illustration of a high gain Josephson junction device having control means overlying the junction.

FIG. 1 shows a high gain Josephson current device using overlying control superconductors. In this device, the Josephson junction 10 is comprised of superconducting electrodes 12 and 14 which are separated by a thin tunneling barrier 16. Electrodes 12 and 14 can be any superconductive materials, such as metals and semiconductors. Tunnel barrier 16 can be an insulator such as an oxide of electrode 12, or even vacuum. It must be thin enough to support Josephson tunneling current therethrough, and is usually 2–50A.

The Josephson device 10 is deposited on an underlying insulator 18 which in turn is deposited on a superconducting ground plane 20. The ground plane 20 can be any superconductive metal, such as niobium. The insulating layer 18 is comprised of any known insulator, such as $SiO_2$ or niobium oxide. Ground plane 18 is deposited as a thin sheet on the substrate 22, which can be an insulator such as glass.

Located over Josephson device 10 and insulated therefrom are superconducting control elements which comprise the control means for Josephson device 10. In this illustration, the control lines are the superconductors 24, 26, and 28 and the insulation is layer 32, which could be SiO. Of these control lines, superconductor 26 is most important, since it is the current $K_iI_J$ through conductor 26 which provides the asymmetric dependence of the Josephson device 10 on external magnetic fields. This asymmetric relationship enables Josephson device 10 to operate as a high gain device.

Current source 10A provides Josephson current $I_J$ to Josephson device 10 while current sources 24A provides control current $I_c$ to superconductive control line 24. Current source 26A provides current $K_iI_J$ to control line 26, while current source 28A provides current $I_b$ to control line 28. A control means 30 connects current source 10A to current source 26A to insure that the current flowing in control line 26 is instantaneously proportional to the Josephson current $I_J$ flowing in Josephson device 10. If desired, the current source 10A could be connected directly to control line 26, thereby avoiding the need for control circuitry 30. However, use of this circuitry allows a variation in the constant of proportionality $K_i$.

Current flow through the control conductors 24, 26, and 28 and will produce magnetic fields which intercept the plane of Josephson device 10. These magnetic fields influence the maximum Josephson current $I_m$ which can flow through the junction without switching from the zero voltage state to the finite voltage state. The magnetic field produced by current $I_c$ is $H_c$, the magnetic field produced by current $K_iI_J$ flowing through line 26 is $H_J$, while the magnetic field produced by current $I_b$ flowing through line 28 is $H_b$. The combination of these magnetic fields is the total field H linking the junction of Josephson device 10.

As mentioned previously, it is not critical that junction device 10 be linear or non-linear. Further, the particular geometry of the junction is not critical. This means that the length *l* of the junction and the width *w* need not be fixed within any particular amounts. Very small junctions can be used.

Figure 2:
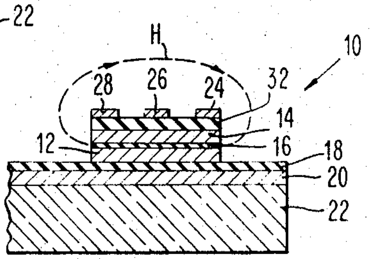
FIG. 2 is a cross-sectional view of the device of FIG. 1, showing the magnetic field lines produced by the control means.

FIG. 2 is the cross-sectional view of the Josephson device of FIG. 1. In this drawing, the insulation 32 which separates the control conductors 24, 26, 28 from top electrode 14 and from one another is shown. Also, the magnetic field H produced by the combined current in conductors 24, 26, and 28 is illustrated by the dashed line intercepting device 10.

Although the device of FIG. 1 shows the control currents $I_c$, $K_iI_J$, and $I_b$ flowing in the same direction, this is not critical. Further, the thickness of insulating region 32 is not critical. This thickness is sufficient to prevent tunneling current from flowing between any of the conductors 24, 26, and 28, and between the control conductors 24, 26, 28 and top electrode 14. The various control lines 24, 26, and 28 need not be the same height above electrode 14. The thickness and width of the control conductors 24, 26, and 28 is not critical and will be described further in the specification.

Figure 3:
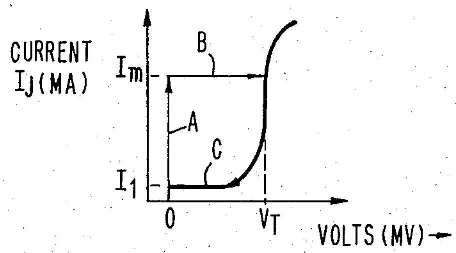
FIG. 3 is a current versus voltage plot for a Josephson junction.

Before preceding to the operation of this high gain Josephson device, the current versus voltage curve of a Josephson device will be described. In FIG. 3, the Josephson current $I_J$ is plotted as a function of the voltage developed across the junction. Starting with zero voltage, current flows through tthe junction to a maximum current $I_m$ as indicated by portion A of the curve. When this maximum Josephson current is reached, the junction switches from a zero voltage state to a voltage $V_T$, as indicated by portion B of the curve. Thus, the pair tunneling phenomenon associated with Josephson current changes to conventional single particle tunneling at the voltage state $V_T$. As the current $I_J$ through the junction is then decreased, the voltage across the junction decreases and the portion C of the curve is traced. Due to hysteris in the junction, a current $I_1$ is usually reached, rather than zero current. Increasing the current from $I_1$ will again retrace portion A of the curve. Thus, by changing the maximum Josephson current $I_m$ which the junction can sustain, the junction can be made to switch from a zero voltage state to a finite voltage state. The two stable voltage states of the junction can be representative of binary states. In order to change the maximum Josephson current $I_m$ of the junction, the prior art has taught the use of an overlying superconductor through which current flows. The magnetic field produced by current in this overlying conductor intercepts the junction plane and changes the threshold (maximum) current $I_m$, thereby causing switching of the junction.

Figure 4:
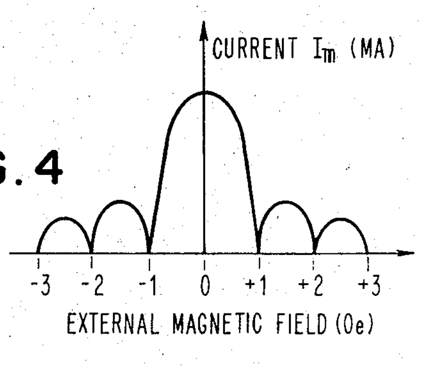
FIG. 4 is a plot illustrating the magnetic dependence of a conventional linear Josephson junction.

The conventional magnetic dependence of a Josephson junction on externally applied magnetic fields (as are produced by control conductors) is shown in FIG. 4. As will be noted, this curve has the shape sin X/X, corresponding to a square linear junction. As is known in the art, the shape of this curve dependes upon the geometry of the junction, and is generally symmetrical about the vertical axes. Although variations in control current $I_c$ will cause variations in maximum Josephson current $I_m$ as is apparent from FIG. 4, the amount of current change $\Delta I_c$ required to cause these changes is large. The present invention seeks to alter the curve of FIG. 4 to create an asymmetry in the curve, thereby providing large current gains with only small changes in control current $I_c$.

Figures 5, 6:
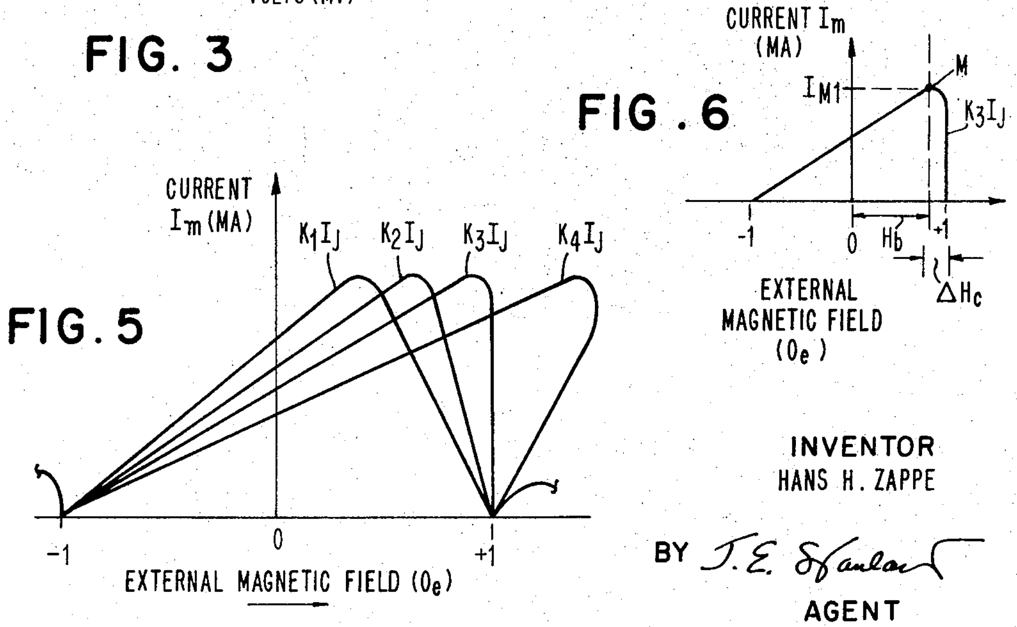
FIG. 5 is a plot of the magnetic dependence of the high gain Josephson junction of the present invention, illustrating the asymmetric dependence on magnetic field and the adjustable gains which can be obtained.
FIG. 6 is a plot of maximum Josephson current $I_m$ versus external magnetic field which illustrates operation of the high gain Josephson device using a bias field and a control field.

FIG. 5 illustrates the asymmetric dependency of maximum Josephson current $I_m$ with external magnetic field for the junction of FIG. 1. As will be more apparent later, the curves of FIG. 5 allow higher gains than the conventional dependence depicted in FIG. 4.

The family of curves presented in FIG. 5 correspond to different amounts of current in superconductive control line 26. As the constant of proportionality $K_i$ increases, the steepness of the curves increases and even overshoots are possible ($K_i$=$K_4$).

To obtain the relationships shown in FIG. 5, the current $K_iI_J$ in control line 26 (FIG. 1) must be instantaneously proportional to the current $I_J$ through Josephson junction device 10. For each curve, the constant of proportionality $K_i$ is constant. That is, $K_i = K_1$ for all currents $I_J$ flowing through Josephson device 10 in order to trace out the curve labelled $K_1I_J$.

In order to illustrate the increased gain of the device with the asymmetrical relationships shown in FIG. 5, a particular example will be discussed. In FIG. 6, only one ($K_3I_J$) of the curves of $I_m$ versus H is shown. Here the device of FIG. 1 employs small changes in control current $I_c$ to create large changes in the maximum Josephson current $I_m$ which are supportable by the Josephson junction device 10. Firstly, the current $K_iI_J$ through control line 26 creates an asymmetrical current-versus-magnetic field relationship. In order to bias device 10 so that a maximum change in current $I_m$ will occur for a small change in control current $I_c$, the bias control line 28 is used. Current $I_b$ in line 28 creates a magnetic field $H_b$ which intercepts device 10. This causes device 10 to have a maximum Josephson current $I_{m_1}$ as illustrated in FIG. 6. If now a small current $I_c$ is present in control line 24, a magnetic field $H_c$ will be created which will additionally intercept device 10. This small magnetic field $H_c$ will shift the operating point of device 10 from point M so that the current $I_m$ in the junction will be decreased (assuming positive values of magnetic field $H_c$). In FIG. 6, current $I_c$ is fluctuated to produce $\Delta H_c$ to shift Josephson device 10 about operating point M. Therefore, currents through the device will undergo rapid transitions between the values 0 and $I_{m1}$ for small changes in control current $I_c$.

Although bias control line 28 is shown in FIG. 1, it is apparent that this line is not needed. If line 28 is not present, current in control line 24 is used to provide the change in Josephson current $I_m$. However, use of bias line 28 provides optimum operating points for maximum amplification.

A device such as that shown in FIG. 1 has uses in logic, memory, and detection. For instance, the device can be used to detect small currents flowing in control line 24. Additionally, the device can be used as a gauss meter for detection of external magnetic fields. In this case, the device is biased at the external magnetic field having value −1 and the presence of a magnetic field to be detected will cause changes in current $I_m$ which are detectable.

This high gain Josephson device can also be used in the manner illustrated in aforementioned Ser. No. 771,101, filed Oct. 28, 1968. That is, the high gain Josephson device can be used in a memory loop as illustrated in FIGS. 1–3 of that application.

Figure 7A:
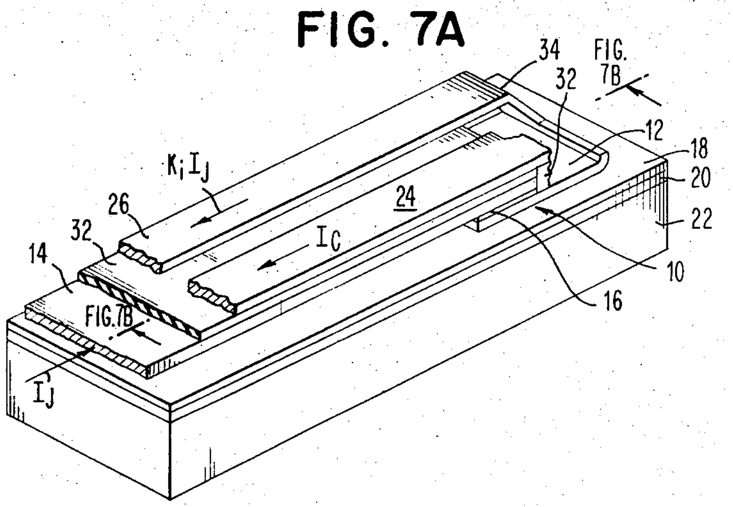
FIG. 7A illustrates a preferred embodiment for obtaining the current $K_iI_J$ in an overlying control superconductor.

FIG. 7A shows the Josephson device 10 having a preferred means for providing the current $K_iI_J$ in line 26. Since current in this control line is to be always proportional to the Josephson current $I_J$ through junction 10, the simplest way for providing this proportionality is to feedback the Josephson current to control conductor 26. In FIG. 7A, this is achieved by the superconductive connection 34 which electrically connects superconducting electrode 12 to control element 26.

In more detail, the structure of FIG. 7A is essentially the same as that of FIG. 1. That is, Josephson device 10 is comprised of superconducting electrodes 12 and 14 which are separated by the tunnel barrier 16. Device 10 is deposited on insulating layer 18, which is in turn deposited or grown upon ground plane 20. Substrate 22 provides overall mechanical stability.

Superconductive bridge 34 connects electrode 12 to overlying control line 26. In this case, the entire Josephson current $I_J$ is fed back, and therefore, $K_i$=1. Also shown in FIG. 7A is the control line 24 having control current $I_c$ flowing therein. For ease of illustration, the bias line 28 is not shown, although it should be understood that such line can easily be provided in the manner shown in FIG. 1.

Figure 7B:
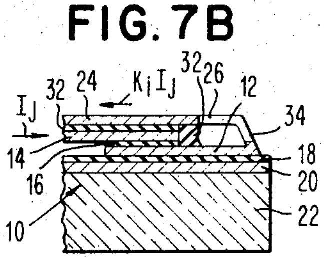
FIG. 7B is a cross-sectional view of the preferred embodiment of FIG. 7A.

FIG. 7B is a cross-sectional view of the device of FIG. 7A. This view illustrates more clearly how the electrode 12 is connected to control element 26. That is, a window is provided in insulation 32, after which the material comprising electrode 12 (or another material) is then deposited over insulation 32 to provide the control line 26 and also the bridge 34 which connects electrode 12 and control line 26.

The device of FIG. 7 is easily made by conventional deposition techniques. For instance, the substrate 22 is an insulator which could be glass. On this is deposited a few thousand angstroms of a superconductive material such as niobium. This functions as the ground plane 20. The niobium can then be oxidized to form a few thousand angstroms of niobium oxide which serves as the insulating layer 18. If desired, an oxide such as SiO is deposited on ground plane 20 to provide insulation 18. After this, the bottom electrode 12 of Josephson device 10 is deposited through a mask. This is a superconductive material having a thickness approximately 1,000–5,000 angstroms. Insulation 32, such as SiO, is then deposited over the entire structure and is etched away in the area to be used for the tunnel barrier 16. Barrier 16 is a thin insulator 2–50 angstroms in thickness which is usually produced by thermal oxidation of the underlying electrode 12. After this, the top superconductive electrode 14 is deposited through a mask onto barrier 16 and onto insulator 32. A window is then etched in insulator 32, after which control line 26 and superconductive bridge 34 are deposited through a mask. This provides the entire structure of the device of FIG. 7A, which is then passivated by an overlying photoresist layer if desired. Of course, the control line 24 (and line 28) can be deposited at the same time as the superconductive line 26.

Figure 8A:
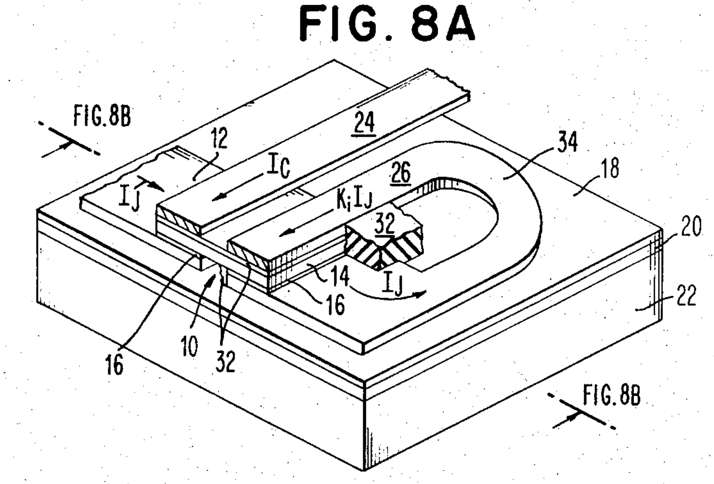
FIG. 8A illustrates another preferred embodiment for obtaining the feedback current $K_iI_J$ in an overlying control superconductor.

FIG. 8A illustrates another embodiment for providing the current $K_iI_J$ through control line 26. As was the case with the device of FIG. 7A, magnetic feedback is provided by feeding back the current $I_J$ flowing through Josephson device 10.

In FIG. 8A, a Josephson device 10 is located on an insulating layer 18, which is deposited on ground plane 20. Ground plane 20 is deposited on insulating substrate 22. In the cross-control Josephson device 10 of FIG. 8A, two junctions are provided in series. That is, two tunnel barriers 16 are provided between superconductive electrodes 12 and 14. As in FIG. 7A, a superconductive bridge 34 connects electrode 12 to overlying control line 26, for feedback of current $K_iI_J$. Again, $K_i$ is 1, and the entire Josephson current $I_J$ is fed back. The bias line 28 is not shown in this figure for ease of illustration, but provision of such line is in accordance with the principles set forth in the description of FIG. 1.

Figure 8B:
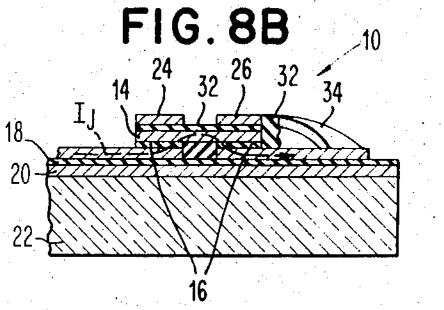
FIG. 8B is a cross-sectional view of the embodiment of FIG. 8A.

FIG. 8B shows a cross-sectional view of the high gain Josephson device of FIG. 8A. A substrate 22 has deposited thereon a superconducting ground plane 20. Insulating layer 18 is a native oxide of ground plane 20 or is any other insulating layer. Located on insulating layer 18 are the superconducting electrodes 12 which are separated from superconducting electrode 14 by tunnel barriers 16 and from each other by insulation 32 (which is sufficiently wide to prevent tunneling current bridging segments 12). Current $I_J$ flows through Josephson device 10 along the direction indicated by the dashed arrow. Electrode 12 is connected to superconducting control line 26 by the bridge 34. Insulation 32 separates control line 26 from control line 24, and also separates these control lines from top electrode 14.

The device of FIG. 8A is made in a manner similar to that in which the device of FIG. 7A was made. That is, ground plane 20 is deposited on substrate 22, and insulating layer 18 is grown or deposited on ground plane 20. The superconducting electrode segments 12 are then deposited through a mask onto layer 18 after which insulation 32 is deposited over electrode segments 12 and between these segments. Windows are provided in insulation 32 in the regions where it is desired to form the tunnel barrier 16. These barriers are produced by, for instance, oxidation of electrode segments 12. After this, superconducting electrode 14 is deposited over the tunnel barriers and over the insulation 32 between electrode segments 12. Insulation 32 between segments 12 is thick enough and wide enough that tunneling does not occur between the segments. After this, a window is provided in insulation 32, and superconductive feedthrough 34 and control line 26 are deposited. The control line 24 could also be deposited at the same time as control line 26 and can be of the same superconductive material.

The dimensions of the various components of the device fall within the same range as described with respect to the device of FIG. 7A. The basic differences between the devices of FIG. 7A and FIG. 8A is that FIG. 7A shows an an in-line device, while the FIG. 8A shows a cross-control device. Operation of the two devices is the same, however.

Figure 9:
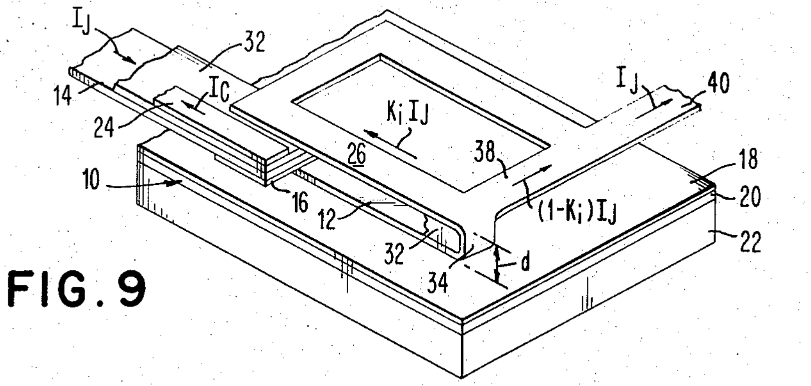
FIG. 9 illustrates an embodiment used to vary the amount of Josephson current returned to the overlying control superconductor.

FIG. 9 illustrates a technique for providing variable control current $K_iI_J$ in the control line 26. Although hown as an in-line control device, the same teaching applies equally to a cross-control device. The Josephson junction device 10 is comprised of electrodes 12 and 14, separated by the tunnel barrier 16. As in previous illustrations, the device is formed on an insulating layer 18 which is located on a ground plane 20. An insulating substrate 22 is provided for the ground plane. Control lines 24 and 26 are located over Josephson junction 10 and are insulated therefrom by an insulating layer 32. The control line 26 is connected to superconducting electrode 12 by the superconductive bridge 34. However, a parallel circuit is connected to bridge 34, one branch of the parallel circuit being comprised of control line 26 while the other is comprised of another superconducting line 38. Control line 26 is looped back to intersect line 38.

The purpose of the parallel connection to bridge 34 is to provide a proportional current $K_iI_J$ through control line 26. That is, current $I_J$ in bridge 34 is split into two portions: $K_iI_J$ and $(1-K_i)I_J$. After control element 26 loops back to contact line 38, the total current flowing in line 40 is $I_J$.

Current is split into respective portions $K_iI_J$and $(1-K_i)I_J$ in accordance with the relative self-inductance L of lines 26 and 38. The self-inductance of either line 26 or line 38 is dependent upon the length of the line, the width of the line, and the distance d between the line and the ground plane 20. Accordingly, the self-inductance of lines 26 and 38 can be adjusted to provide any constant $K_i$. In this fashion, the amount of current $I_J$ in control line 26 is made to depend upon the physical size of that line in relation to line 38, and the distances of lines 26 and 38 from the ground plane. All of these parameters can be easily adjusted during the fabrication process to provide any $K_i$. In practice, it is usually preferrable to make $K_i = 1$ in which case the parallel circuit would not be required.

What has been described is a high gain Josephson device having adjustable gains. The gain obtainable does not depend upon the linearity of the tunnel junction or upon its geometry. The basic principle involved is the provision of a current in an adjacent control line which is proportional at every instant to the Josephson current flowing through the device. This in turn will create a magnetic field proportional to the Josephson current and will create an asymmetry in the magnetic dependence of the junction. While it is most straightforward to provide feedback of the Josephson current itself, other schemes for providing proportional currents in the control conductors can be easily visualized. For instance, the current source providing the Josephson current can be directly coupled to the control line, or a servo-type of network can be established to maintain the desired proportionality.

What is claimed is:

1. A high gain Josephson device comprising:

first and second superconducting electrodes, a tunnel barrier between said electrodes through which DC zero voltage Josephson tunneling currents can pass, current means connected to at least one of said electrodes for providing Josephson current to said device, gain means for providing a magnetic field through said tunnel barrier which is instantaneously proportional to the magnitude of said zero voltage Josephson current through said barrier.

2. The device of claim 1, where said gain means includes means for adjusting the proportionality between said magnetic field and said Josephson current.

3. The device of claim 1, where said gain means a conductor adjacent said Josephson device and insulated therefrom having a current flowing therein which is instantaneously proportional to the magnitude of said Josephson current.

4. The device of claim 3, where said conductor is connected to said current means which provides said Josephson current to said device.

5. The device of claim 3, further including at least one further conductor adjacent said Josephson device, current flow through said further conductor creating a magnetic field intercepting said Josephson device for controlling the amount of maximum Josephson current which can pass through said device.

6. The device of claim 1, where said gain means includes a feedback conductor connected to one of said electrodes for returning a current proportional to said Josephson current in a path adjacent said device, said proportional current producing a magnetic field intercepting said device.

7. The device of claim 6, where said feedback conductor is comprised of the same superconductive material as the electrode to which it is connected.

8. A high gain Josephson device comprising:

a Josephson tunnel junction comprised of:

a first superconducting electrode for receiving DC zero voltage Josephson tunneling current from a current source, a second superconducting electrode for carrying said Josephson current, a tunnel barrier separating said first and second electrodes, said barrier supporting the flow of said zero voltage Josephson current therethrough, a current source for applying said Josephson current to said first electrode, conducting means electrically connected to only one of said electrodes for carrying current proportional to said zero voltage Josephson tunneling current for producing a magnetic field in said junction which is instantaneously proportional to said zero voltage Josephson current at all instants of time.

9. The device of claim 9, where said means is an electrically parallel network of conductors whose self-inductance determines the magnitude of said proportional current which establishes said proportional magnetic field intercepting said junction.

10. The device of claim 8, further including a second conductor insulated from said Josephson device having a bias current therein which produces a bias magnetic field in said junction, and a third conductor insulated from said Josephson device having control current therein which establishes a control magnetic field in said junction, said control current being adjustable in magnitude, a second current source for providing bias current to sais second conductor, and a third current source for providing said control current to said third conductor.

11. The device of claim 8, further including a superconducting ground plane insulated from said Josephson junction.

12. The device of claim 8, wherein said superconducting means feeds back said Josephson current in a conductor which passes adjacent said junction and is insulated therefrom.

13. A high gain Josephson device, comprising:

a superconductive ground plane, a first superconducting electrode insulated from said ground plane, a second superconductive electrode, a tunnel barrier located between said first and second superconductive electrodes, said tunnel barrier being able to support DC zero voltage Josephson tunneling current therethrough, current means connected to said first and second electrodes for providing said Josephson tunneling current through said tunnel barrier, a first conductor located adjacent said second electrode, said first conductor carrying a first current therein which is always instantaneously proportional to said zero voltage Josephson current, said first current producing a first magnetic field which couples to said Josephson device, a second conductor located adjacent said second electrode for carrying a second current therein whose magnitude is variable, said second current producing a second magnetic field which couples to said Josephson device, a second current source connected to said second conductor for providing said second currents therein.

14. The device of claim 13, where said first conductor is electrically connected to only one of said superconducting electrodes.

15. The device of claim 14, where said first conductor is a single branch in a parallel network of conductors electrically connecting said first conductor to one of said electrodes, wherein each branch of said parallel network has different self-inductance.

16. The device of claim 13, where said first conductor is connected to a first current source which provides current that is always instantaneously proportional to said zero voltage Josephson tunneling current through said device.

17. The device of claim 16, where said first current source is comprised of said Josephson device.

18. The device of claim 16, where said first current source is comprised of said current means connected to said first and second electrodes.

19. The device of claim 13, including at least one further conductor located adjacent said second electrode and insulated therefrom having current therein which creates a magnetic field in said tunnel barrier.

* * * * *